(12) United States Patent
Shan (10) Patent No.: US 11,307,470 B2
(45) Date of Patent: Apr. 19, 2022

(54) ARRAY SUBSTRATE AND DISPLAY PANEL (71) Applicant: HKC CORPORATION LIMITED, Shenzhen (CN)

(72) Inventor: Jianfeng Shan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 562 days.

(21) Appl. No.: 16/349,987

(22) PCT Filed: Nov. 21, 2018

(86) PCT No.: PCT/CN2018/116620
§ 371 (c)(1),
(2) Date: May 15, 2019

(87) PCT Pub. No.: WO2020/097960
PCT Pub. Date: May 22, 2020

(65) Prior Publication Data
US 2021/0356825 A1    Nov. 18, 2021

(30) Foreign Application Priority Data

Nov. 14, 2018   (CN) .......................... 201811350593.9

(51) Int. Cl.
*H01L 27/12*   (2006.01)
*G02F 1/1362*   (2006.01)
*G02F 1/1368*   (2006.01)

(52) U.S. Cl.
CPC ...... *G02F 1/136286* (2013.01); *G02F 1/1368* (2013.01); *G02F 1/13624* (2013.01); *H01L 27/124* (2013.01)

(58) Field of Classification Search
None
See application file for complete search history.

(56) References Cited

U.S. PATENT DOCUMENTS

| 2006/0038175 | A1 | 2/2006 | Lai |
| 2006/0038180 | A1 | 2/2006 | Lai |
| 2009/0213290 | A1 | 8/2009 | Ochiai et al. |
| 2017/0227826 | A1* | 8/2017 | Heo ..................... H01L 27/1248 |

(Continued)

FOREIGN PATENT DOCUMENTS

| CN | 101216649 A | 7/2008 |
| CN | 202142534 U | 2/2012 |

(Continued)

OTHER PUBLICATIONS

International Search Report issued in corresponding International application No. PCT/CN2018/116620, dated Dec. 8, 2019.

(Continued)

*Primary Examiner* — Benjamin P Sandvik (57) ABSTRACT

The present application discloses an array substrate and a display panel. The array substrate includes a display region, a plurality of pixels, scanning lines, and active switches. Each pixel corresponds to two scanning lines and two active switches; the scanning lines include an intersection scanning line segment and other scanning line segments; and a width of the intersection scanning line segment is at least less than 1.5 times widths of the other scanning line segments.

17 Claims, 4 Drawing Sheets

(56) References Cited

U.S. PATENT DOCUMENTS

| | | | |
|---|---|---|---|
| 2017/0277008 A1* | 9/2017 | Jiang | G02F 1/136286 |
| 2019/0027497 A1* | 1/2019 | Long | G02F 1/134363 |
| 2019/0172844 A1* | 6/2019 | Su | H01L 27/3262 |
| 2019/0250451 A1* | 8/2019 | Xu | H01L 27/1255 |
| 2020/0105791 A1* | 4/2020 | Bai | H01L 27/124 |

FOREIGN PATENT DOCUMENTS

| | | |
|---|---|---|
| CN | 102508386 A | 6/2012 |
| CN | 104865763 A | 8/2015 |
| CN | 105489610 A | 4/2016 |
| CN | 107145018 A | 9/2017 |

OTHER PUBLICATIONS

Written opinion of the international Search Authority in corresponding International application No. PCT/CN2018/116620, dated Dec. 8, 2019.
First Office Action from China patent office in a counterpart Chinese patent Application 201811350593.9, dated Mar. 1, 2020 (6 pages).
Second Office Action from China patent office in a counterpart Chinese patent Application 201811350593.9, dated Jul. 30, 2020 (4 pages).

\* cited by examiner

| Realized projects | Description | H2/H1 | Number of measurement | Flicker | Schematic diagram |
|---|---|---|---|---|---|
| 1 | H1 is increased to 1 μm, and H2 is increased to 1 μm | 1.505 | 85 | 1.6-9 | |
| 2 | H1 remains unchanged, and the position of H2 is increased to 1 μm | 1.6 | 90 | 1.5-9 | |
| 3 | H1 is decreased by 1 μm, and the position of H2 is increased by 3 μm | 2 | 180 | 1.5-7 | |
| 4 | H1 is increased by 1 μm, and the position of H2 is decreased by 2 μm | 1 | 180 | 2-12 | |

ARRAY SUBSTRATE AND DISPLAY PANEL

The present application claims priority to the Chinese Patent Application No. CN201811350593.9, filed to the Chinese Patent Office on Nov. 14, 2018, and entitled "ARRAY SUBSTRATE AND DISPLAY PANEL", which is incorporated herein by reference in its entirety.

TECHNICAL FIELD

The present application relates to the technical field of display, and in particular, to an array substrate and a display panel.

BACKGROUND

The statements herein merely provide background information related to the present application and do not necessarily constitute the prior art.

With the development and advancement of technologies, a liquid crystal display has many advantages such as thin body, power-saving, and no radiation, and thus has been widely used. Most of the liquid crystal displays currently available on the market are backlight liquid crystal displays, which include a liquid crystal panel and a backlight module. The liquid crystal panel includes a Color Film Substrate (CF Substrate) (also called a color filter substrate), a Thin Film Transistor Substrate (TFT Substrate), and a mask, and transparent electrodes are disposed on opposite sides of the substrates. A Liquid Crystal (LC) molecule layer is sandwiched between two substrates.

In the design of the five-mask product, the design does not clearly define the line width ratio of an intersection scanning line segment position of a dual-scanning line driving circuit in a display region and the scanning line segments at other positions, which may cause the produced scanning line segment to affect the product yield rate due to the disconnection. Moreover, the line width is too small, the impedance is too large, the signal uniformity is worse, or the line width of the intersection scanning line segment is too large, resulting in an increase in parasitic capacitance, serious signal transmission interference, and affecting the product quality.

SUMMARY

An objective of the present application is to provide an array substrate and a display panel for improving the product quality.

To achieve the foregoing objective, the present application provides an array substrate, including:
 a display region formed on the array substrate;
 a plurality of pixels formed in the display region;
 data lines formed in the display region, each pixel corresponding to one data line;
 scanning lines formed in the display region and intersected with the data lines, each pixel corresponding to two scanning lines, and the two scanning lines being disposed complementarily in shape; and
 active switches formed in the display region, each pixel corresponding to two active switches, and source electrodes of the two active switches being connected to the same data line, and drain electrodes thereof being respectively connected to two scanning lines;
 the scanning lines include:
 an interaction scanning line segment located at the intersection of the scanning lines and the data lines; and
 other scanning line segments corresponding to the rest part of the scanning lines except the interaction scanning line segment;
 a width of the intersection scanning line segment is at least less than 1.5 times widths of the other scanning line segments.

Optionally, the other scanning line segments include:
 a first scanning line segment, being a scanning line segment connected to the active switch and connected to the intersection scanning line segment;
 a second scanning line segment, being a scanning line segment connected to the first scanning line segment and having a line width larger than that of the intersection scanning line segment;
 a third scanning line segment, being a scanning line segment connected to the intersection scanning line segment and not the first scanning line segment; and
 a fourth scanning line segment, being a scanning line segment connected to the third scanning line segment and having a line width larger than that of the intersection scanning line segment.

Optionally, the line width of the first scanning line segment, the line width of the third scanning line segment, and the line width of the fourth scanning line segment are at least equal to the line width of the second scanning line segment.

Optionally, the line width of the first scanning line segment, the line width of the second scanning line segment, and the line width of the fourth scanning line segment are at least equal to the line width of the third scanning line segment.

Optionally, the line width of the first scanning line segment, the line width of the second scanning line segment, and the line width of the third scanning line segment are at least equal to the line width of the fourth scanning line segment.

Optionally, the line width of the second scanning line segment, the line width of the third scanning line segment, and the line width of the fourth scanning line segment are at least equal to the line width of the first scanning line segment.

Optionally, the line width of the first scanning line segment is larger than the line width of the second scanning line segment and the line width of the fourth scanning line segment; and the line width of the second scanning line segment is equal to the line width of the fourth scanning line segment.

Optionally, a sum of the line width of the first scanning line segment and the line width of the third scanning line segment is equal to a sum of the line width of the second scanning line segment and the line width of the fourth scanning line segment.

Optionally, the line width of the first scanning line segment is equal to the line width of the second scanning line segment, the line width of the third scanning line segment, and the line width of the fourth scanning line segment.

The present application further provides an array substrate, including:
 a display region formed on the array substrate;
 a plurality of pixels formed in the display region;
 data lines formed in the display region, each pixel corresponding to one data line;
 scanning lines formed in the display region and intersected with the data lines, each pixel corresponding to two scanning lines, and the two scanning lines being disposed complementarily in shape; and
 active switches formed in the display region, each pixel corresponding to two active switches, and source electrodes of the two active switches being connected to the same data line, and drain electrodes thereof being respectively connected to two scanning lines;

the scanning lines include:

an interaction scanning line segment located at the intersection of the scanning lines and the data lines; and other scanning line segments corresponding to the rest part of the scanning lines except the interaction scanning line segment;

a width of the intersection scanning line segment is at least less than 1.5 times widths of the other scanning line segments;

the other scanning line segments are classified and named as follows: a scanning line segment connected to the active switch and connected to the intersection scanning line segment is a first scanning line segment; a scanning line segment connected to the first scanning line segment and having a line width larger than that of the intersection scanning line segment is a second scanning line segment; a scanning line segment connected to the intersection scanning line segment and not the first scanning line segment is a third scanning line segment; and a scanning line segment connected to the third scanning line segment and having a line width larger than that of the intersection scanning line segment is a fourth scanning line segment;

the line width of the first scanning line segment, the line width of the second scanning line segment, and the line width of the fourth scanning line segment are at least equal to the line width of the third scanning line segment;

the line width of the first scanning line segment is larger than the line width of the second scanning line segment and the line width of the fourth scanning line segment; and the line width of the second scanning line segment is equal to the line width of the fourth scanning line segment.

The present application further provides a display panel, including an array substrate, the array substrate including:

a display region formed on the array substrate;

a plurality of pixels formed in the display region;

data lines formed in the display region, each of the pixels corresponding to one data line;

scanning lines formed in the display region and intersected with the data lines, each of the pixels corresponding to two scanning lines, and the two scanning lines being disposed complementarily in shape; and active switches formed in the display region, each of the pixels corresponding to two active switches, and source electrodes of the two active switches being connected to the same data line, and drain electrodes thereof being respectively connected to two scanning lines;

the scanning lines include:

an interaction scanning line segment located at the intersection of the scanning lines and the data lines; and other scanning line segments corresponding to the rest part of the scanning lines except the interaction scanning line segment;

a width of the intersection scanning line segment is at least less than 1.5 times widths of the other scanning line segments.

Optionally, the other scanning line segments include:

a first scanning line segment, being a scanning line segment connected to the active switch and connected to the intersection scanning line segment;

a second scanning line segment, being a scanning line segment connected to the first scanning line segment and having a line width larger than that of the intersection scanning line segment;

a third scanning line segment, being a scanning line segment connected to the intersection scanning line segment and not the first scanning line segment; and a fourth scanning line segment, being a scanning line segment connected to the third scanning line segment and having a line width larger than that of the intersection scanning line segment.

Optionally, the line width of the first scanning line segment, the line width of the third scanning line segment, and the line width of the fourth scanning line segment are at least equal to the line width of the second scanning line segment.

Optionally, the line width of the first scanning line segment, the line width of the second scanning line segment, and the line width of the fourth scanning line segment are at least equal to the line width of the third scanning line segment.

Optionally, the line width of the first scanning line segment, the line width of the second scanning line segment, and the line width of the third scanning line segment are at least equal to the line width of the fourth scanning line segment.

Optionally, the line width of the second scanning line segment, the line width of the third scanning line segment, and the line width of the fourth scanning line segment are at least equal to the line width of the first scanning line segment.

Optionally, the line width of the first scanning line segment is larger than the line width of the second scanning line segment and the line width of the fourth scanning line segment; and the line width of the second scanning line segment is equal to the line width of the fourth scanning line segment.

Optionally, the line width of the first scanning line segment is equal to the line width of the second scanning line segment, the line width of the third scanning line segment, and the line width of the fourth scanning line segment.

By providing a spacing unit in a peripheral region at a corresponding position of a recess, a depth of the recess being less than twice a thickness of a second metal layer, the present application effectively improves the thickness uniformity of a liquid crystal box of the display panel, thereby effectively improving the phenomenon of uneven brightness of the display panel, so that the display effect of the display panel is optional, further improving the display quality of the display panel. Moreover, the setting of the recess effectively limits the spacing unit, effectively avoiding displacement of the spacing unit, ensuring optional operation of the liquid crystal in the liquid crystal box, thereby ensuring more uniform color and brightness of the display panel, and further improving the display effect of the display panel, so as to enhance the product competitiveness well.

BRIEF DESCRIPTION OF DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts.

In the accompanying drawings.

DETAILED DESCRIPTION

The specific structure and function details disclosed herein are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose, and cannot be understood as indicating or implying a relative importance, or implicitly indicating the number of the indicated technical features. Hence, the features defined by "first" and "second" can explicitly or implicitly include one or more features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or electrically connected; or directly connected or indirectly connected through an intermediate medium, or in an internal communication between two elements. The specific meanings about the foregoing tens in the present application may be understood by a person of ordinary skill in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

In the drawings, units of similar structures are represented by the same reference numeral.

As shown in FIGS. 1-9, embodiments further describe the array substrate and the display panel of the present application in details.

An array substrate, including:

a display region 110 formed on the array substrate 100;

a plurality of pixels 120 formed in the display region 110;

data lines 111 formed in the display region 110, each pixel 120 corresponding to one data line 111;

scanning lines 112 formed in the display region 110 and intersected with the data lines 111, each pixel 120 corresponding to two scanning lines 112, and the two scanning lines 112 being disposed complementarily in shape; and active switches 113 formed in the display region 110, each pixel 120 corresponding to two active switches 113, and source electrodes 121 of the two active switches 113 being connected to the same data line 111, and drain electrodes 122 thereof being respectively connected to two scanning lines 112;

the scanning lines 112 include:

an interaction scanning line segment 210 located at the intersection of the scanning lines 112 and the data lines 111; and other scanning line segments corresponding to the rest part of the scanning lines 112 except the interaction scanning line segment 210;

a width of the intersection scanning line segment 210 is at least less than 1.5 times widths of the other scanning line segments.

In the present solution, since the design of Thin Film Transistor-Liquid Crystal Displays (TFT-LCDs) does not explicitly define the proportional relationship between line widths of the position of the intersection scanning line segment 210 of the dual-driving scanning line in the display region 110 and the position of the scanning line segment, the produced product may have a series of defects, affecting the yield. Therefore, the present solution obtains through some experimental designs and verification results that: for the same main scanning line, the width of the intersection scanning line segment 210 is at least less than 1.5 times widths of other scanning line segments; in this way, it is possible to avoid the disconnection of other scanning line segments from affecting the yield of the product, and also to avoid the situation that the impedance is too large and the signal uniformity is deteriorated due to the too small width of the other scanning line segments, and the width ratio design of the product, i.e., the scanning line does not affect the PH exposure capability. Moreover, the increase of the parasitic capacitance and the serious signal transmission interference caused by the too large width of the intersection scanning line segment 210 can be avoided, thereby improving the product yield.

In an embodiment, the other scanning line segments 112 include: a scanning line segment connected to the active switch 113 and connected to the intersection scanning line segment 210 is a first scanning line segment 220; a scanning line segment connected to the first scanning line segment 220 and having a line width larger than that of the intersection scanning line segment 210 is a second scanning line segment 230; a scanning line segment connected to the intersection scanning line segment 210 and not the first scanning line segment 220 is a third scanning line segment 240; and a scanning line segment connected to the third scanning line segment 240 and having a line width larger than that of the intersection scanning line segment 210 is a fourth scanning line segment 250.

In an embodiment, two scanning lines 112 are disposed in a rectangular shape.

In an embodiment, the line width of the first scanning line segment 220, the line width of the third scanning line segment 240, and the line width of the fourth scanning line segment 250 are at least equal to the line width of the second scanning line segment 230.

In the present solution, since the widths of other scanning line segments are at least larger than 1.5 times the width of the intersection scanning line segment 210, the line width of the first scanning line segment 220, the line width of the third scanning line segment 240, and the line width of the fourth scanning line segment 250 are designed to be at least equal to the line width of the second scanning line segment 230, so as to avoid the increase of the parasitic capacitance and the serious signal transmission interference caused by the too large width of the intersection scanning line segment 210, thereby improving the product yield.

In an embodiment, the line width of the first scanning line segment 220, the line width of the second scanning line segment 230, and the line width of the fourth scanning line segment 250 are at least equal to the line width of the third scanning line segment 240.

In the present solution, since the widths of other scanning line segments are at least larger than 1.5 times the width of the intersection scanning line segment 210, the line width of the first scanning line segment 220, the line width of the second scanning line segment 230, and the line width of the fourth scanning line segment 250 are designed to be at least equal to the line width of the third scanning line segment 240, so as to avoid the increase of the parasitic capacitance and the serious signal transmission interference caused by the too large width of the intersection scanning line segment 210, thereby improving the product yield.

In an embodiment, the line width of the first scanning line segment 220, the line width of the second scanning line segment 230, and the line width of the third scanning line segment 240 are at least equal to the line width of the fourth scanning line segment 250.

In the present solution, since the widths of other scanning line segments are at least larger than 1.5 times the width of the intersection scanning line segment 210, the line width of the first scanning line segment 220, the line width of the second scanning line segment 230, and the line width of the third scanning line segment 240 are designed to be at least equal to the line width of the fourth scanning line segment 250, so as to avoid the increase of the parasitic capacitance and the serious signal transmission interference caused by the too large width of the intersection scanning line segment 210, thereby improving the product yield.

In an embodiment, the line width of the second scanning line segment 230, the line width of the third scanning line segment 240, and the line width of the fourth scanning line segment 250 are at least equal to the line width of the first scanning line segment 220.

In the present solution, since the widths of other scanning line segments are at least larger than 1.5 times the width of the intersection scanning line segment 210, the line width of the second scanning line segment 230, the line width of the third scanning line segment 240, and the line width of the fourth scanning line segment 250 are designed to be at least equal to the line width of the first scanning line segment 220, so as to avoid the increase of the parasitic capacitance and the serious signal transmission interference caused by the too large width of the intersection scanning line segment 210, thereby improving the product yield.

In an embodiment, the line width of the first scanning line segment 220 is larger than the line width of the second scanning line segment 230 and the line width of the fourth scanning line segment 250.

In the present solution, since two scanning lines are disposed in parallel, the two scanning lines are disposed in a rectangular shape, where the first scanning line segment 220 and the third scanning line segment 240 are complementary in shape and correspond to each other in position, and the second scanning line segment 230 and the fourth scanning line segment 250 are complementary in shape and correspond to each other in position. However, since only the first scanning line segment 220 is installed therein with an active switch 113, the first scanning line segment 220 has a certain width enough to accommodate the active switch 113, and such factor is not considered in other scanning line segments. Therefore, in the present solution, for the scanning line segments except the intersection scanning line segment 210, the line width of the first scanning line segment 220 is designed to be maximum, and accordingly, the line width of the third scanning line segment 240 is designed to be minimum, and the line width of the second scanning line segment 230 and the line width of the fourth scanning line segment 250 are designed to be larger than the line width of the third scanning line segment 240, but to be less than the line width of the first scanning line segment 220.

In an embodiment, the line width of the second scanning line segment 230 is equal to the line width of the fourth scanning line segment 250.

In the present solution, since the line width of the second scanning line segment 230 and the line width of the fourth scanning line segment 250 are only designed to be at least larger than 1.5 times the width of the intersection scanning line segment 210, considering the fact that a sum of line widths of the two scanning line segments is a definite value, the line width of the scanning line is inversely proportional to the impedance, and large impedance causes the signal uniformity to be worse. Therefore, to ensure the signal uniformity of the second scanning line segment 230 and the fourth scanning line segment 250 to be consistent, the present solution designs the line width of the second scanning line segment and the line width of the fourth scanning line segment 250 to be equal, thereby ensuring the product yield.

In an embodiment, the line width of the first scanning line segment 220 is equal to the line width of the second scanning line segment 230, the line width of the third scanning line segment 240, and the line width of the fourth scanning line segment 250.

In the present solution, since a sum of the line width of the first scanning line segment 220 and the line width of the second scanning line segment 230 is a definite value, and a sum of the line width of the third scanning line segment 240 and the line width of the fourth scanning line segment 250 is a definite value, considering the fact that the line width of the scanning line is inversely proportional to the impedance, and large impedance causes the signal uniformity to be worse. Therefore, to ensure the signal uniformity of the scanning lines to be consistent, the present solution designs the line width of the first scanning line segment 220 to be equal to the line width of the second scanning line segment 230, the line width of the third scanning line segment 240, and the line width of the fourth scanning line segment 250, thereby ensuring the product yield.

Figure 8:
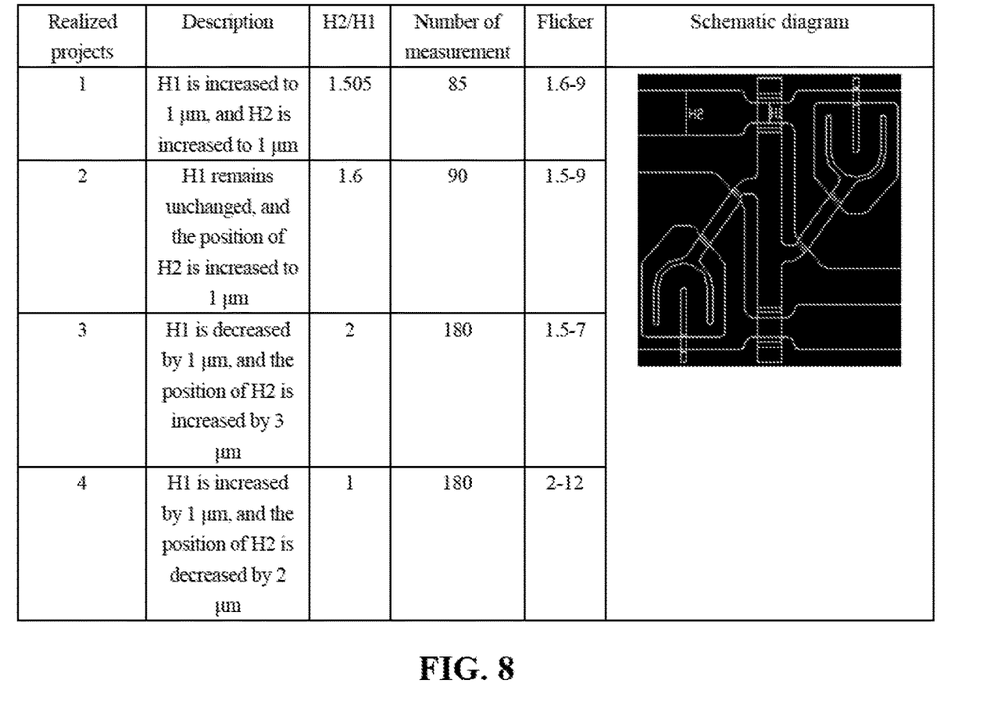
FIG. 8 is a schematic diagram corresponding to different ratios in an experimental statistical table according to an embodiment of the present application.
Figure 9:
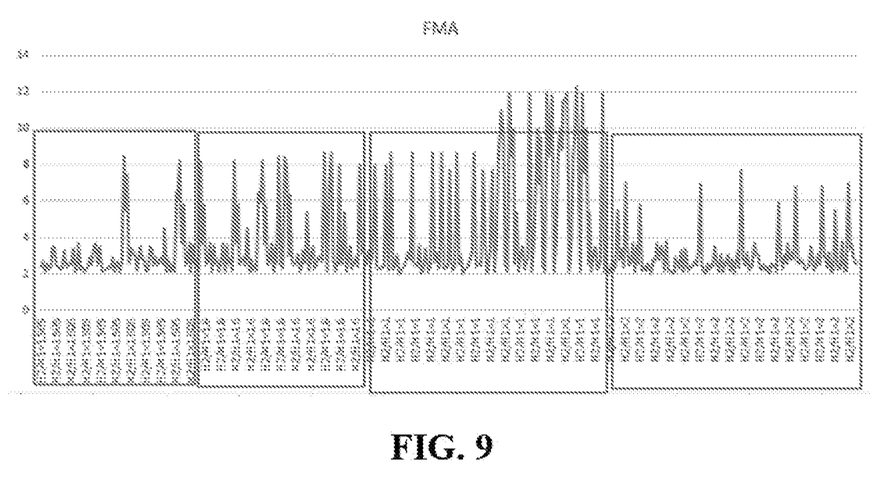
FIG. 9 is a schematic diagram of failure mode analysis of electrical stability changes corresponding to different ratios of line widths of the scanning line segments according to an embodiment of the present application.

In an embodiment, as shown in FIGS. 8 and 9, disclosed are experimental data statistical tables of the width ratios of other scanning line segments to the intersection scanning line segment 210, and it can be seen from FIGS. 8 and 9 that the swing range when the ratio is greater than 1.5 is smaller than the swing range when the ratio is less than 1.5, it is more stable.

Figure 1:
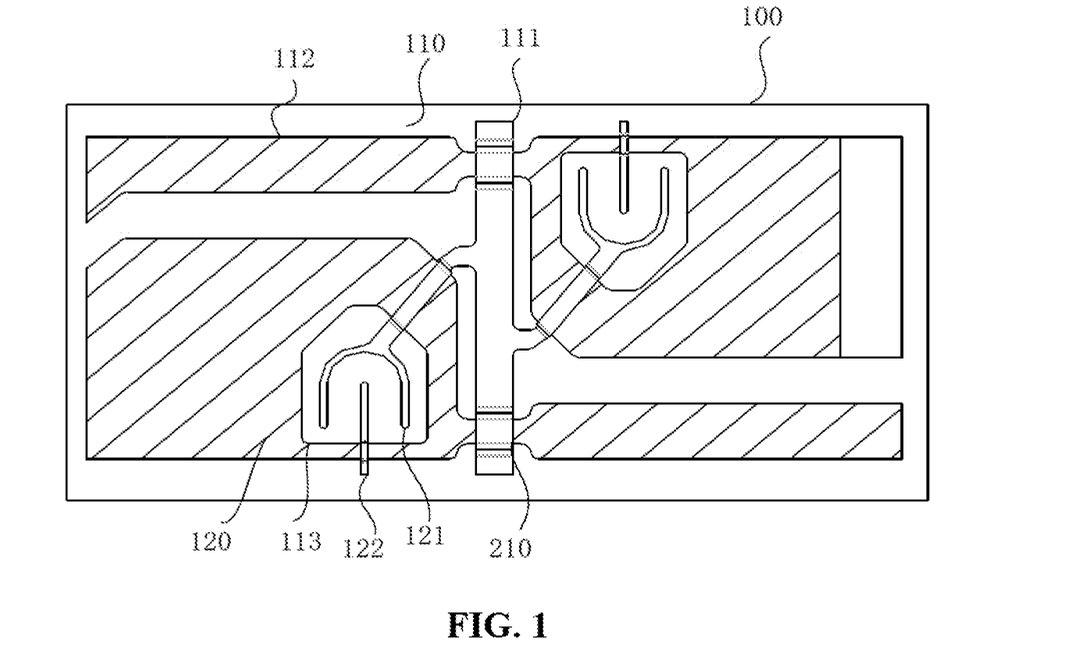
FIG. 1 is a partial schematic structural diagram of a dual-driving scanning line according to an embodiment of the present application.
Figure 2:
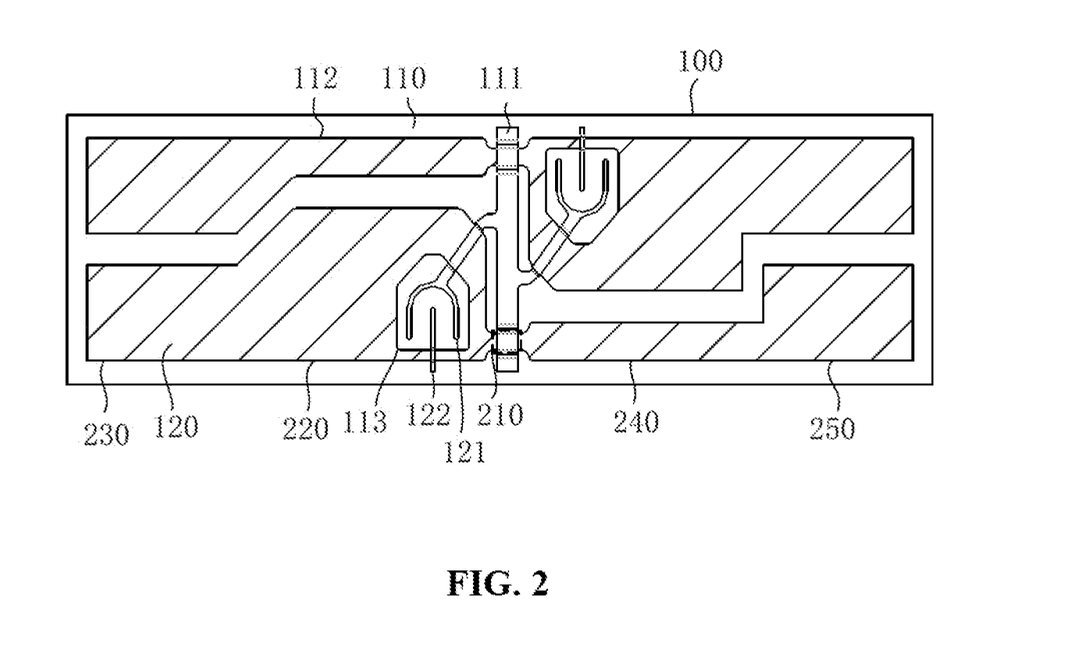
FIG. 2 is a schematic structural diagram of a dual-driving scanning line according to an embodiment of the present application.
Figure 3:
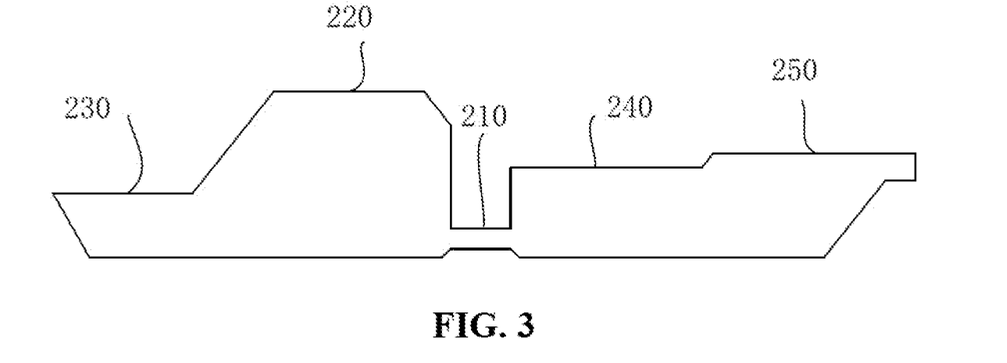
FIG. 3 is a schematic structural diagram of a second scanning line segment of a smaller line width according to an embodiment of the present application.
Figure 4:
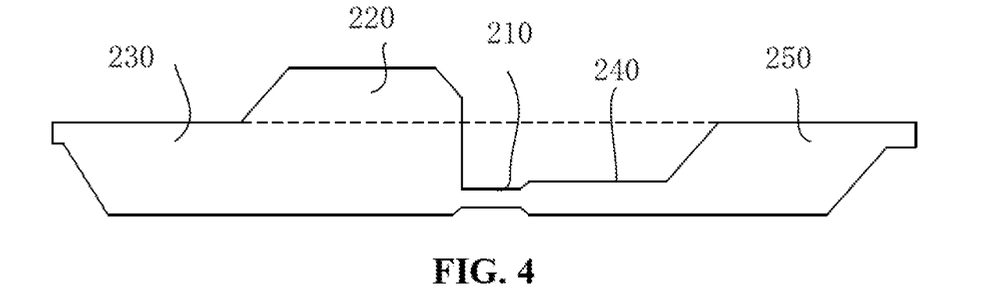
FIG. 4 is a schematic structural diagram of a third scanning line segment of a smaller line width according to an embodiment of the present application.
Figure 5:
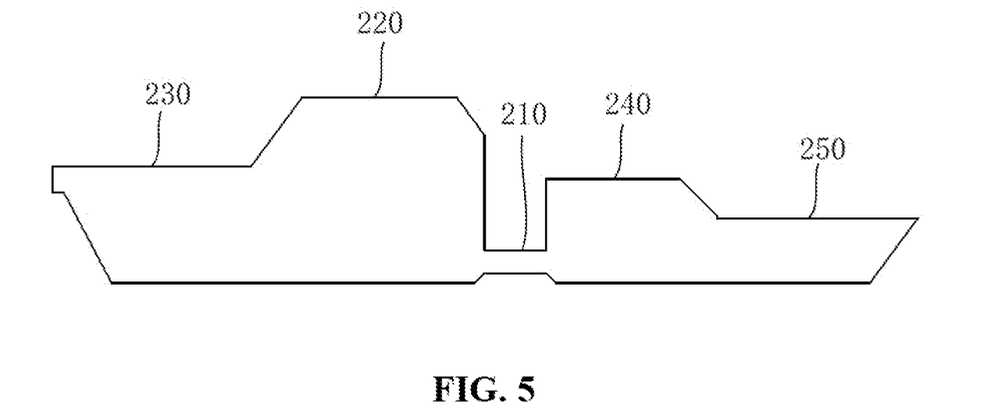
FIG. 5 is a schematic structural diagram of a fourth scanning line segment of a smaller line width according to an embodiment of the present application.
Figure 6:
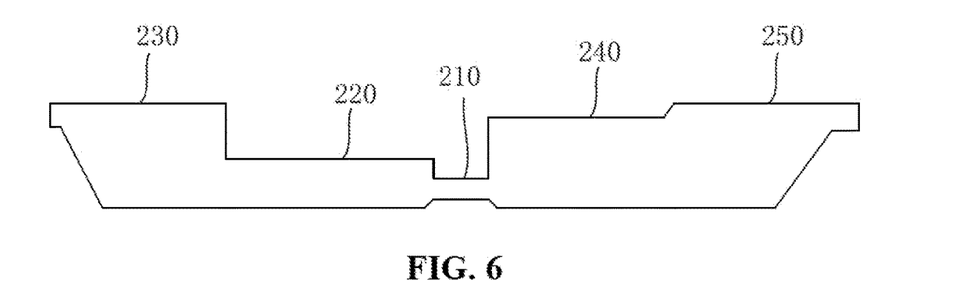
FIG. 6 is a schematic structural diagram of a first scanning line segment of a smaller line width according to an embodiment of the present application.
Figure 7:
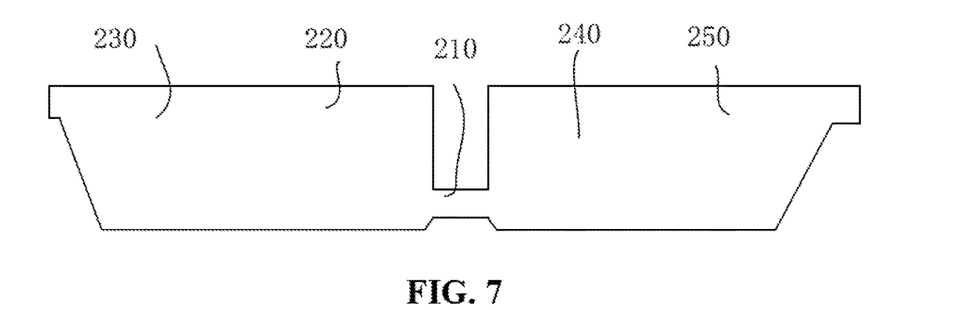
FIG. 7 is a schematic structural diagram of other scanning line segments of an equal line width according to an embodiment of the present application.

As shown in FIG. 3, disclosed is an array substrate, including:
  a display region 110 formed on the array substrate 100;
  a plurality of pixels 120 formed in the display region 110;
  data lines 111 formed in the display region 110, each pixel 120 corresponding to one data line 111;
  scanning lines 112 formed in the display region 110 and intersected with the data lines 111, each pixel 120 corresponding to two scanning lines 112, the two scanning lines 112 being disposed complementarily in shape, and two scanning lines 112 being disposed in a rectangular shape; and
  active switches 113 formed in the display region 110, each pixel 120 corresponding to two active switches 113, and source electrodes 121 of the two active switches 113 being connected to the same data line 111, and drain electrodes 122 thereof being respectively connected to two scanning lines 112;
  the scanning lines 112 include:
  an interaction scanning line segment 210 located at the intersection of the scanning lines 112 and the data lines 111; and
  other scanning line segments corresponding to the rest part of the scanning lines 112 except the interaction scanning line segment 210;
  a width of the intersection scanning line segment 210 is at least less than 1.5 times widths of the other scanning line segments.

The other scanning line segments 112 include: a scanning line segment connected to the active switch 113 and connected to the intersection scanning line segment 210 is a first scanning line segment 220; a scanning line segment connected to the first scanning segment 220 and having a line width larger than that of the intersection scanning line segment 210 is a second scanning line segment 230; a scanning line segment connected to the intersection scanning line segment 210 and not the first scanning line segment 220 is a third scanning line segment 240; and a scanning line segment connected to the third scanning line segment 240 and having a line width larger than that of the intersection scanning line segment 210 is a fourth scanning line segment 250.

The line width of the first scanning line segment 220, the line width of the second scanning line segment 230, and the line width of the fourth scanning line segment 250 are at least equal to the line width of the third scanning line segment 240.

The line width of the first scanning line segment 220 is larger than the line width of the second scanning line segment 230 and the line width of the fourth scanning line segment 250.

The line width of the second scanning line segment 230 is equal to the line width of the fourth scanning line segment 250.

In the present solution, since the design of TFT-LCDs does not explicitly define the proportional relationship between line widths of the position of the intersection scanning line segment 210 of the dual-driving scanning line in the display region 110 and the position of the scanning line segment, the produced product may have a series of defects, affecting the yield. Therefore, the present solution obtains through some experimental designs and verification results that: for the same main scanning line, the width of the intersection scanning line segment 210 is at least less than 1.5 times widths of other scanning line segments; in this way, it is possible to avoid the disconnection of other scanning line segments from affecting the yield of the product, and also to avoid the situation that the impedance is too large and the signal uniformity is deteriorated due to the too small width of the other scanning line segments, and the width ratio design of the product, i.e., the scanning line does not affect the PH exposure capability. Moreover, the increase of the parasitic capacitance and the serious signal transmission interference caused by the too large width of the intersection scanning line segment 210 can be avoided, thereby improving the product yield. Since the widths of other scanning line segments are at least larger than 1.5 times the width of the intersection scanning line segment 210, the line width of the first scanning line segment 220, the line width of the second scanning line segment 230, and the line width of the fourth scanning line segment 250 are designed to be at least equal to the line width of the third scanning line segment 240, so as to avoid the increase of the parasitic capacitance and the serious signal transmission interference caused by the too large width of the intersection scanning line segment 210, thereby improving the product yield. Since two scanning lines are disposed in parallel, the two scanning lines are disposed in a rectangular shape, where the first scanning line segment 220 and the third scanning line segment 240 are complementary in shape and correspond to each other in position, and the second scanning line segment 230 and the fourth scanning line segment 250 are complementary in shape and correspond to each other in position. However, since only the first scanning line segment 220 is installed therein with an active switch 113, the first scanning line segment 220 has a certain width enough to accommodate the active switch 113, and such factor is not considered in other scanning line segments. Therefore, in the present solution, for the scanning line segments except the intersection scanning line segment 210, the line width of the first scanning line segment 220 is designed to be maximum, and accordingly, the line width of the third scanning line segment 240 is designed to be minimum, and the line width of the second scanning line segment 230 and the line width of the fourth scanning line segment 250 are designed to be larger than the line width of the third scanning line segment 240, but to be less than the line width of the first scanning line segment 220. Since the line width of the second scanning line segment 230 and the line width of the fourth scanning line segment 250 are only designed to be at least larger than 1.5 times the width of the intersection scanning line segment 210, considering the fact that a sum of line widths of the two scanning line segments is a definite value, the line width of the scanning line is inversely proportional to the impedance, and large impedance causes the signal uniformity to be worse. Therefore, to ensure the signal uniformity of the second scanning line segment 230 and the fourth scanning line segment 250 to be consistent, the present solution designs the line width of the second scanning line segment and the line width of the fourth scanning line segment 250 to be equal, thereby ensuring the product yield.

As shown in FIGS. 1-9, disclosed is a display panel, including an array substrate 100.

The contents above are detailed descriptions of the present application in conjunction with specific optional embodiments, and the specific implementation of the present application is not limited to these descriptions. It will be apparent to a person of ordinary skill in the art that various simple deductions or substitutions may be made without departing from the spirit of the present application, and should be considered to fall into the scope of protection of the present application.

What is claimed is:

1. An array substrate, comprising:
a display region formed on the array substrate;
a plurality of pixels formed in the display region;
data lines formed in the display region, each of the pixels corresponding to one data line;
scanning lines formed in the display region and intersected with the data lines, each of the pixels corresponding to two scanning lines, and the two scanning lines being disposed complementarily in shape; and
active switches formed in the display region, each of the pixels corresponding to two active switches, and source electrodes of the two active switches being connected to the same data line, and drain electrodes thereof being respectively connected to two scanning lines;
the scanning lines comprise:
an interaction scanning line segment located at the intersection of the scanning lines and the data lines; and
other scanning line segments corresponding to the rest part of the scanning lines except the interaction scanning line segment;
a width of the intersection scanning line segment is at least less than 1.5 times widths of the other scanning line segments.

2. The array substrate according to claim 1, wherein the other scanning line segments comprise:
a first scanning line segment, being a scanning line segment connected to the active switch and connected to the intersection scanning line segment;
a second scanning line segment, being a scanning line segment connected to the first scanning line segment and having a line width larger than that of the intersection scanning line segment;
a third scanning line segment, being a scanning line segment connected to the intersection scanning line segment and not the first scanning line segment; and
a fourth scanning line segment, being a scanning line segment connected to the third scanning line segment and having a line width larger than that of the intersection scanning line segment.

3. The array substrate according to claim 2, wherein the line width of the first scanning line segment, the line width of the third scanning line segment, and the line width of the fourth scanning line segment are at least equal to the line width of the second scanning line segment.

4. The array substrate according to claim 2, wherein the line width of the first scanning line segment, the line width of the second scanning line segment, and the line width of the fourth scanning line segment are at least equal to the line width of the third scanning line segment.

5. The array substrate according to claim 2, wherein the line width of the first scanning line segment, the line width of the second scanning line segment, and the line width of the third scanning line segment are at least equal to the line width of the fourth scanning line segment.

6. The array substrate according to claim 2, wherein the line width of the second scanning line segment, the line width of the third scanning line segment, and the line width of the fourth scanning line segment are at least equal to the line width of the first scanning line segment.

7. The array substrate according to claim 4, wherein the line width of the first scanning line segment is larger than the line width of the second scanning line segment and the line width of the fourth scanning line segment; and the line width of the second scanning line segment is equal to the line width of the fourth scanning line segment.

8. The array substrate according to claim 2, wherein the line width of the first scanning line segment is equal to the line width of the second scanning line segment, the line width of the third scanning line segment, and the line width of the fourth scanning line segment.

9. An array substrate, comprising:
a display region formed on the array substrate;
a plurality of pixels formed in the display region;
data lines formed in the display region, each pixel corresponding to one data line;
scanning lines formed in the display region and intersected with the data lines, each pixel corresponding to two scanning lines, and the two scanning lines being disposed complementarily in shape; and
active switches formed in the display region, each pixel corresponding to two active switches, and source electrodes of the two active switches being connected to the same data line, and drain electrodes thereof being respectively connected to two scanning lines;
the scanning lines comprise:
an interaction scanning line segment located at the intersection of the scanning lines and the data lines; and
other scanning line segments corresponding to the rest part of the scanning lines except the interaction scanning line segment;
a width of the intersection scanning line segment is at least less than 1.5 times widths of the other scanning line segments;
the other scanning line segments are classified and named as follows: a scanning line segment connected to the active switch and connected to the intersection scanning line segment is a first scanning line segment; a scanning line segment connected to the first scanning line segment and having a line width larger than that of the intersection scanning line segment is a second scanning line segment; a scanning line segment connected to the intersection scanning line segment and not the first scanning line segment is a third scanning line segment; and a scanning line segment connected to the third scanning line segment and having a line width larger than that of the intersection scanning line segment is a fourth scanning line segment;
the line width of the first scanning line segment, the line width of the second scanning line segment, and the line width of the fourth scanning line segment are at least equal to the line width of the third scanning line segment;

the line width of the first scanning line segment is larger than the line width of the second scanning line segment and the line width of the fourth scanning line segment; and the line width of the second scanning line segment is equal to the line width of the fourth scanning line segment.

10. A display panel, comprising an array substrate, the array substrate comprising:

a display region formed on the array substrate;

a plurality of pixels formed in the display region;

data lines formed in the display region, each of the pixels corresponding to one data line;

scanning lines formed in the display region and intersected with the data lines, each of the pixels corresponding to two scanning lines, and the two scanning lines being disposed complementarily in shape; and active switches formed in the display region, each of the pixels corresponding to two active switches, and source electrodes of the two active switches being connected to the same data line, and drain electrodes thereof being respectively connected to two scanning lines;

the scanning lines comprise:

an interaction scanning line segment located at the intersection of the scanning lines and the data lines; and other scanning line segments corresponding to the rest part of the scanning lines except the interaction scanning line segment;

a width of the intersection scanning line segment is at least less than 1.5 times widths of the other scanning line segments.

11. The display panel according to claim 10, wherein the other scanning line segments comprise:

a first scanning line segment, being a scanning line segment connected to the active switch and connected to the intersection scanning line segment;

a second scanning line segment, being a scanning line segment connected to the first scanning line segment and having a line width larger than that of the intersection scanning line segment;

a third scanning line segment, being a scanning line segment connected to the intersection scanning line segment and not the first scanning line segment; and a fourth scanning line segment, being a scanning line segment connected to the third scanning line segment and having a line width larger than that of the intersection scanning line segment.

12. The display panel according to claim 11, wherein the line width of the first scanning line segment, the line width of the third scanning line segment, and the line width of the fourth scanning line segment are at least equal to the line width of the second scanning line segment.

13. The display panel according to claim 11, wherein the line width of the first scanning line segment, the line width of the second scanning line segment, and the line width of the fourth scanning line segment are at least equal to the line width of the third scanning line segment.

14. The display panel according to claim 11, wherein the line width of the first scanning line segment, the line width of the second scanning line segment, and the line width of the third scanning line segment are at least equal to the line width of the fourth scanning line segment.

15. The display panel according to claim 11, wherein the line width of the second scanning line segment, the line width of the third scanning line segment, and the line width of the fourth scanning line segment are at least equal to the line width of the first scanning line segment.

16. The display panel according to claim 13, wherein the line width of the first scanning line segment is larger than the line width of the second scanning line segment and the line width of the fourth scanning line segment; and the line width of the second scanning line segment is equal to the line width of the fourth scanning line segment.

17. The display panel according to claim 11, wherein the line width of the first scanning line segment is equal to the line width of the second scanning line segment, the line width of the third scanning line segment, and the line width of the fourth scanning line segment.

* * * * *